United States Patent
Li et al.

(10) Patent No.: US 10,036,912 B2
(45) Date of Patent: Jul. 31, 2018

(54) DISPLAY SUBSTRATE, METHOD FOR MANUFACTURING THE DISPLAY SUBSTRATE, LIQUID CRYSTAL DISPLAY DEVICE AND OLED DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui Province (CN)

(72) Inventors: Ji Li, Beijing (CN); Zhen Zhang, Beijing (CN)

(73) Assignees: BOE TECHNOLOGY GROUP CO., LTD, Beijing (CN); HEFEI BOE OPTOELECTRONICS TECHNOLOGY CO., LTD., Hefei, Anhui (CN)

(*) Notice: Subject to any disclaimer, the term of this patent is extended or adjusted under 35 U.S.C. 154(b) by 113 days.

(21) Appl. No.: 14/589,967

(22) Filed: Jan. 5, 2015

(65) Prior Publication Data
US 2016/0178948 A1 Jun. 23, 2016

(30) Foreign Application Priority Data
Dec. 22, 2014 (CN) .......................... 2014 1 0800933

(51) Int. Cl.
*G02F 1/1335* (2006.01)
*G02F 1/1333* (2006.01)
(Continued)

(52) U.S. Cl.
CPC ........ *G02F 1/13338* (2013.01); *H01L 27/323* (2013.01); *H01L 51/5203* (2013.01); *H01L 51/5284* (2013.01); *G02F 1/133512* (2013.01)

(58) Field of Classification Search
CPC ....... G06F 3/041; G06F 3/0414; G06F 3/0412
See application file for complete search history.

(56) References Cited

U.S. PATENT DOCUMENTS

| | | | |
|---|---|---|---|
| 2012/0256877 A1 | 10/2012 | Lin et al. | |
| 2014/0070350 A1* | 3/2014 | Kim | G06F 3/044 257/432 |

(Continued)

FOREIGN PATENT DOCUMENTS

| CN | 102043531 A | 5/2011 |
|---|---|---|
| CN | 104049801 A | 9/2014 |

(Continued)

OTHER PUBLICATIONS

Chinese Office Action with English Language Translation, dated Dec. 23, 2016, Chinese Application No. 201410800933.9.
(Continued)

*Primary Examiner* — Phu Vu
(74) *Attorney, Agent, or Firm* — Womble Bond Dickinson (US) LLP

(57) ABSTRACT

The embodiments of the present invention disclose a display substrate, a method for manufacturing the display substrate, a liquid crystal display device and an OLED display device. The display substrate comprises: a base substrate; and multiple metal touch electrodes formed in the same layer on the first/second side of the base substrate; each touch electrode comprising an emitting electrode and a receiving electrode. Since the multiple metal touch electrodes are formed in the same layer on the first/second side of the base substrate, this technology uses mask plates as less as possible; the resistance is relatively small; the high temperature annealing is not required; and the scratch resistance ability is strong; many defects of the existing single layer ITO touch panel technology can be eliminated effectively.

13 Claims, 2 Drawing Sheets

(51) Int. Cl.
    *H01L 27/32*     (2006.01)
    *H01L 51/52*     (2006.01)

(56) References Cited

U.S. PATENT DOCUMENTS

| | | | | |
|---|---|---|---|---|
| 2014/0125889 A1* | 5/2014 | Choi | ............ | G06F 3/0412 |
| | | | | 349/12 |
| 2015/0060255 A1* | 3/2015 | Chen | ............ | H03K 17/9622 |
| | | | | 200/5 R |
| 2015/0077368 A1* | 3/2015 | Chen | ............ | G06F 3/0416 |
| | | | | 345/173 |
| 2015/0177882 A1* | 6/2015 | Kim | ............ | G06F 3/044 |
| | | | | 345/174 |
| 2015/0309644 A1* | 10/2015 | Sun | ............ | G06F 3/0412 |
| | | | | 345/173 |

FOREIGN PATENT DOCUMENTS

| | | | |
|---|---|---|---|
| CN | 104123053 | A | 10/2014 |
| CN | 204302944 | U | 4/2015 |
| TW | 201439834 | A | 10/2014 |
| TW | I502424 | B | 10/2015 |

OTHER PUBLICATIONS

Office Action in Chinese Application No. 201410800933.9 dated Jun. 16, 2017, with English translation.

\* cited by examiner

DISPLAY SUBSTRATE, METHOD FOR MANUFACTURING THE DISPLAY SUBSTRATE, LIQUID CRYSTAL DISPLAY DEVICE AND OLED DISPLAY DEVICE

RELATED APPLICATIONS

The present application claims the benefit of Chinese Patent Application No. 201410800933.9, filed Dec. 22, 2014, the entire disclosure of which is incorporated herein by reference.

FIELD OF THE INVENTION

The present invention relates to the display field, in particular to a display substrate, a method for manufacturing the display substrate, a liquid crystal display device and an OLED (organic electroluminescent) display device.

BACKGROUND OF THE INVENTION

At present, touch screen technology has been increasingly applied in display technique. The existing touch screen technology mainly comprises resistive touch screen, capacitive touch screen and infrared optical touch screen. Since the capacitive touch screen has higher speed response than resistive touch screen, and can realize multi-point touch, it has a good market prospect in the field of touch screen; infrared optical touch screen technology is mainly applied in the large size touch screen.

For capacitive touch screen, currently it can usually be realized with the following three types of technologies: the OGS technology, which directly attaches a touch screen to a display panel; the in cell technology, which embeds a touch panel into a panel; and the on cell technology, which embeds a touch screen between a display panel and a polarizer. Since the attaching technology requires additional purchasing the touch screen, the cost being high and the thickness of the panel being increased, it has gradually be eliminated. For the in cell technology, as the touch circuit is within the display panel, the noise of the touch circuit has a great disturbance to the electric field inside the display panel, this technology is still not mature. Therefore, the on cell technology using multilayer or single layer ITO has attracted more and more attention.

However, the multilayer technology has multiple processes of exposure and development, the cost is high, and it is difficult for the promotion of the technology. Single layer ITO technology has many shortcomings due to the damages to the display of high annealing temperature, the large resistance of ITO, being apt to be scratched during the production process, and other reasons.

SUMMARY OF THE INVENTION

For the above reasons, it is desired to provide a capacitive touch screen technology, which can effectively eliminate many defects of the existing single layer ITO touch panel technology without affecting the display effect.

To this end, embodiments of the present invention provide a display substrate, a method for manufacturing the display substrate, a liquid crystal display device and an OLED display device.

According to an aspect of the present invention, an embodiment of the present invention provides a display substrate, wherein the display substrate comprises: a base substrate; and multiple metal touch electrodes formed in the same layer on the first/second side of the base substrate; each touch electrode comprising an emitting electrode and a receiving electrode.

Since the multiple metal touch electrodes are formed in the same layer on the first/second side of the base substrate, this technology uses mask plates as less as possible; the resistance is relatively small; the high temperature annealing is not required; and the scratch resistance ability is strong; many defects of the existing single layer ITO touch panel technology can be eliminated effectively.

Preferably, each touch electrode has a rectangular shape; the emitting electrode and the receiving electrode have substantially the same and complementary shapes.

Optionally, the emitting electrode and the receiving electrode have stair shapes.

Preferably, the emitting electrode and the receiving electrode have a thickness ranged from 300-500 nm.

Preferably, the material of the touch electrodes is molybdenum or molybdenum-aluminum alloy.

Preferably, the display substrate further comprises an optical layer formed on the first/second side of the base substrate; wherein the multiple metal touch electrodes are formed on a surface of the base substrate; or, the multiple metal touch electrodes are formed on a surface of the optical layer facing the base substrate; or, the multiple metal touch electrodes are formed on a surface of the optical layer away from the base substrate.

Preferably, the display substrate further comprises a black matrix; wherein in a direction perpendicular to the display substrate, the projection of the black matrix covers the projection of the multiple metal touch electrodes.

According to another aspect of the present invention, an embodiment of the present invention further provides a method for manufacturing the above mentioned display substrate, wherein the method comprises: providing a base substrate; and forming multiple metal touch electrodes in the same layer on the first/second side of the base substrate; each touch electrode comprising an emitting electrode and a receiving electrode.

Since the multiple metal touch electrodes are formed in the same layer on the first/second side of the base substrate, this technology uses mask plates as less as possible; the resistance is relatively small; the high temperature annealing is not required; and the scratch resistance ability is strong; many defects of the existing single layer ITO touch panel technology can be eliminated effectively.

Preferably, each touch electrode has a rectangular shape; the emitting electrode and the receiving electrode have substantially the same and complementary shapes.

Optionally, the emitting electrode and the receiving electrode have stair shapes.

Preferably, the emitting electrode and the receiving electrode have a thickness ranged from 300-500 nm.

Preferably, the material of the touch electrodes is molybdenum or molybdenum-aluminum alloy.

Preferably, the method further comprises: forming an optical layer on the first/second side of the base substrate; wherein the multiple metal touch electrodes are formed on a surface of the base substrate; or, the multiple metal touch electrodes are formed on a surface of the optical layer facing the base substrate; or, the multiple metal touch electrodes are formed on a surface of the optical layer away from the base substrate.

Preferably, the method further comprises: forming a black matrix on the display substrate; wherein in a direction perpendicular to the display substrate, the projection of the black matrix covers the projection of the multiple metal touch electrodes.

Preferably, forming multiple metal touch electrodes comprises: forming a metal film; and forming the multiple metal touch electrodes with a patterning process.

According to still another aspect of the present invention, an embodiment of the present invention further provides a liquid crystal display device, wherein the liquid crystal display device comprises the above mentioned display substrate.

According to yet another aspect of the present invention, an embodiment of the present invention further provides an organic electroluminescent display device, wherein the organic electroluminescent display device comprises the above mentioned display substrate.

DETAILED DESCRIPTION OF THE INVENTION

Detailed description on the embodiments of the present invention will be made in combination with the drawings. It should be noted that, throughout the description, the same or similar reference numbers indicate the same or similar elements, or the elements with the same or similar function. The embodiments are provided by way of explanation of the disclosure, and are not meant as a limitation of the invention.

In the context of the present invention, "being formed in the same layer" means being formed on the same plane without mutual overlap. A "side" of a substrate indicates a side located in a direction perpendicular to the extension plane of the substrate; a "surface" of the substrate indicates a surface of the substrate, which surface is parallel with the extension plane of the substrate; moreover, "a direction perpendicular to the display substrate" indicates a direction perpendicular to the extension plane of the display substrate.

Figure 1:
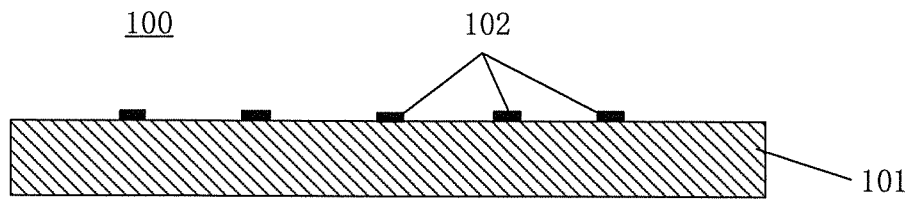
FIG. 1 is a schematic view of a display substrate according to an embodiment of the present invention.
Figure 2:
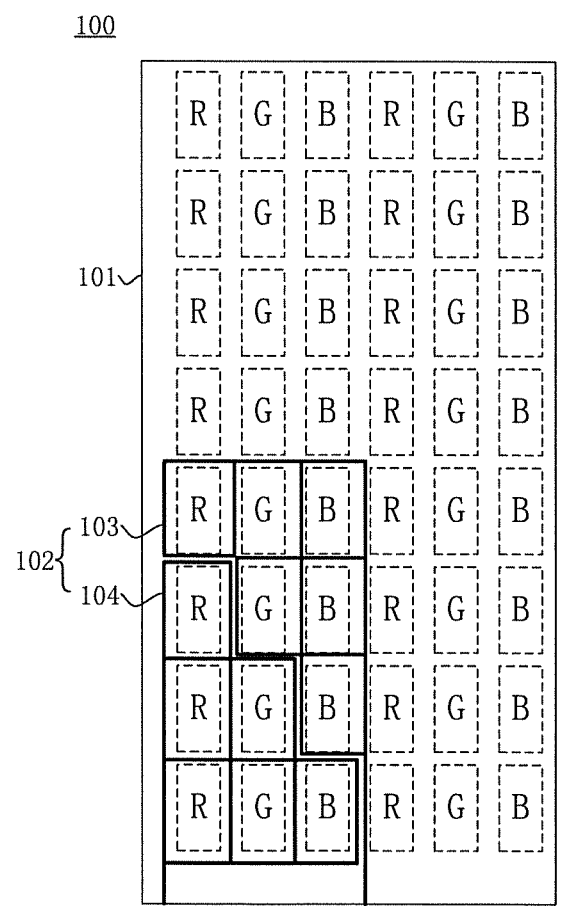
FIG. 2 is a top view of a display substrate according to an embodiment of the present invention.

FIG. 1 is a schematic view of a display substrate according to an embodiment of the present invention; FIG. 2 is a top view of a display substrate according to an embodiment of the present invention; wherein the dashed boxes indicate the regions corresponding to pixels or sub-pixels (e.g., RGB sub-pixels) of a display device, in which display device the display substrate according to an embodiment of the present invention is provided.

According to an aspect of the present invention, an embodiment of the present invention provides a display substrate 100, wherein the display substrate 100 comprises: a base substrate 101; and multiple metal touch electrodes 102 formed in the same layer on the first/second side of the base substrate 101; each touch electrode 102 comprising an emitting electrode 103 and a receiving electrode 104 (as shown in FIG. 2).

Since the multiple metal touch electrodes are formed in the same layer on the first/second side of the base substrate, this technology uses mask plates as less as possible; the resistance is relatively small; the high temperature annealing is not required; and the scratch resistance ability is strong; many defects of the existing single layer ITO touch panel technology can be eliminated effectively.

Preferably, each touch electrode has a rectangular shape; the emitting electrode and the receiving electrode have substantially the same and complementary shapes.

Though, in the embodiment of the present invention, the touch electrode is shaped rectangular, those skilled in the art can understand that the touch electrode can also be shaped in other shapes (for example but not limited to: trapezoid, parallelogram, triangle, etc.). The emitting electrode and the receiving electrode having substantially the same and complementary shapes can increase the capacitance between the emitting electrode and the receiving electrode effectively, and promote the sensitivity of the touch control.

Optionally, the emitting electrode and the receiving electrode have stair shapes.

The emitting electrode and the receiving electrode being shaped with stair shapes can maximize the capacitance between the emitting electrode and the receiving electrode, and thus promote the sensitivity of the touch control. Those skilled in the art can understand that the shapes of the emitting electrode and the receiving electrode do not necessarily be stair shapes; moreover, the areas of the emitting electrode and the receiving electrode do not necessarily cover 6 pixels respectively as shown in FIG. 2. That is, as long as the adjacent edges between the emitting electrode and the corresponding receiving electrode have a sufficient length, a desired capacitance can be generated.

Preferably, the emitting electrode and the receiving electrode have a thickness ranged from 300-500 nm, thereby a good conductivity can be ensured, and a large step between the touch electrode and other layer can be avoided.

Preferably, the material of the touch electrodes is molybdenum or molybdenum-aluminum alloy.

Molybdenum or molybdenum-aluminum alloy is suitable to be used as the emitting electrode and the receiving electrode due to good thermal conductivity, electrical conductivity and low expansion coefficient. Those skilled in the art can understand that other metal or alloy suitable for metal deposition process (for example but not limited to: gold, silver, platinum, iridium, etc.) can also be used in the embodiments of the present invention.

Preferably, in order to cooperate with different types of display, the display substrate further comprises an optical layer formed on the first/second side of the base substrate; wherein the multiple metal touch electrodes are formed on a surface of the base substrate; or, the multiple metal touch electrodes are formed on a surface of the optical layer facing the base substrate; or, the multiple metal touch electrodes are formed on a surface of the optical layer away from the base substrate.

Preferably, the display substrate further comprises a black matrix; wherein in a direction perpendicular to the display substrate, the projection of the black matrix covers the projection of the multiple metal touch electrodes.

Since in the direction perpendicular to the display substrate, the projection of the black matrix covers the projection of the multiple metal touch electrodes, the touch electrodes will not affect the aperture ratio of any pixel or sub-pixel (as it is known that usually the aperture ratio of the pixel is limited by the line width of the black matrix); therefore, the display effect of the display device will not be affected.

According to another aspect of the present invention, an embodiment of the present invention further provides a method for manufacturing the above mentioned display substrate, wherein the method comprises: providing a base substrate; and forming multiple metal touch electrodes in the same layer on the first/second side of the base substrate; each touch electrode comprising an emitting electrode and a receiving electrode.

Since the multiple metal touch electrodes are formed in the same layer on the first/second side of the base substrate, this technology uses mask plates as less as possible; the resistance is relatively small; the high temperature annealing is not required; and the scratch resistance ability is strong; many defects of the existing single layer ITO touch panel technology can be eliminated effectively.

Preferably, each touch electrode has a rectangular shape; the emitting electrode and the receiving electrode have substantially the same and complementary shapes.

Though, in the embodiment of the present invention, the touch electrode is shaped rectangular, those skilled in the art can understand that the touch electrode can also be shaped in other shapes (for example but not limited to: trapezoid, parallelogram, triangle, etc.). The emitting electrode and the receiving electrode having substantially the same and complementary shapes can increase the capacitance between the emitting electrode and the receiving electrode effectively, and promote the sensitivity of the touch control.

Optionally, the emitting electrode and the receiving electrode have stair shapes.

The emitting electrode and the receiving electrode being shaped with stair shapes can maximize the capacitance between the emitting electrode and the receiving electrode, and thus promote the sensitivity of the touch control. Those skilled in the art can understand that the shapes of the emitting electrode and the receiving electrode do not necessarily be stair shapes; moreover, the areas of the emitting electrode and the receiving electrode do not necessarily cover 6 pixels respectively as shown in FIG. 2. That is, as long as the adjacent edges between the emitting electrode and the corresponding receiving electrode have a sufficient length, a desired capacitance can be generated.

Preferably, the emitting electrode and the receiving electrode have a thickness ranged from 300-500 nm, thereby a good conductivity can be ensured, and a large step between the touch electrode and other layer can be avoided.

Preferably, the material of the touch electrodes is molybdenum or molybdenum-aluminum alloy.

Molybdenum or molybdenum-aluminum alloy is suitable to be used as the emitting electrode and the receiving electrode due to good thermal conductivity, electrical conductivity and low expansion coefficient. Those skilled in the art can understand that other metal or alloy suitable for metal deposition process (for example but not limited to: gold, silver, platinum, iridium, etc.) can also be used in the embodiments of the present invention.

Preferably, in order to cooperate with different types of display, the method further comprises: forming an optical layer on the first/second side of the base substrate; wherein the multiple metal touch electrodes are formed on a surface of the base substrate; or, the multiple metal touch electrodes are formed on a surface of the optical layer facing the base substrate; or, the multiple metal touch electrodes are formed on a surface of the optical layer away from the base substrate.

Preferably, the method further comprises: forming a black matrix on the display substrate; wherein in a direction perpendicular to the display substrate, the projection of the black matrix covers the projection of the multiple metal touch electrodes.

Since in the direction perpendicular to the display substrate, the projection of the black matrix covers the projection of the multiple metal touch electrodes, the touch electrodes will not affect the aperture ratio of any pixel or sub-pixel (as it is known that usually the aperture ratio of the pixel is limited by the line width of the black matrix); therefore, the display effect of the display device will not be affected.

Preferably, forming multiple metal touch electrodes comprises: forming a metal film; and forming the multiple metal touch electrodes with a patterning process.

According to still another aspect of the present invention, an embodiment of the present invention further provides a liquid crystal display device, wherein the liquid crystal display device comprises the above mentioned display substrate. The liquid crystal display device can be a liquid crystal display panel, an LCD TV, and a device such as mobile phone, notebook, navigator or PDA, etc., which comprises the liquid crystal display panel.

Figure 3:
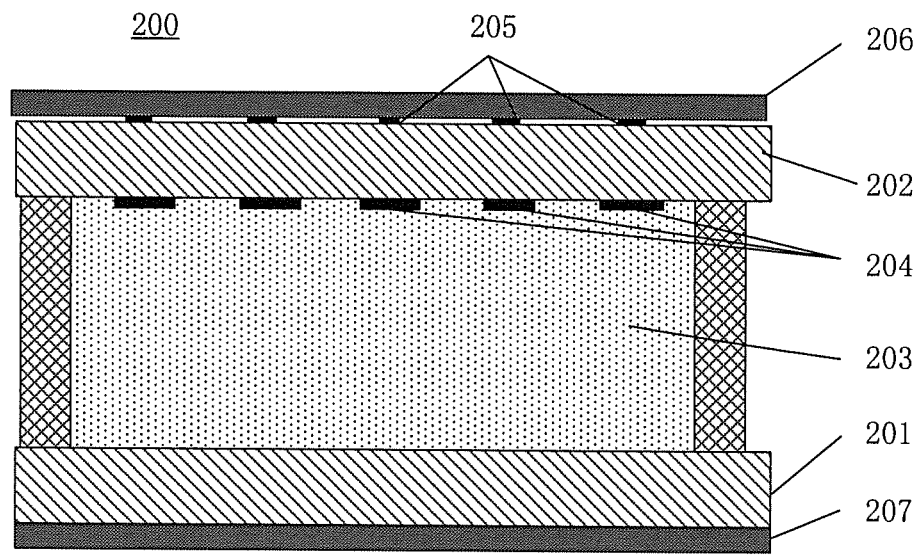
FIG. 3 is a schematic view of a liquid crystal display device according to an embodiment of the present invention.

FIG. 3 is a schematic view of a liquid crystal display device according to an embodiment of the present invention. The liquid crystal display device 200 comprises: an array substrate 201 and a color film substrate 202 oppositely disposed, the color film substrate 202 being constituted by the above mentioned display substrate; a liquid crystal layer 203 filled between the array substrate 201 and the color film substrate 202; the color film substrate having a first side facing the array substrate 201 and a second side away from the first side; a black matrix 204 formed on the first side; multiple touch electrodes 205 formed in the same layer on the second side; each touch electrode 205 comprising an emitting electrode and a receiving electrode; wherein in a direction perpendicular to the color film substrate 202 (i.e., the display substrate), the projection of the black matrix 204 covers the projection of the multiple metal touch electrodes 205; and optical layers 206, 207 (e.g., polarizers) respectively formed on both sides of the liquid crystal display device 200.

According to yet another aspect of the present invention, an embodiment of the present invention further provides an organic electroluminescent display device, wherein the organic electroluminescent display device comprises the above mentioned display substrate. The organic electroluminescent display device can be an OLED display panel, an OLED TV, and a device such as mobile phone, notebook, navigator or PDA, etc., which comprises the OLED display panel.

Figure 4:
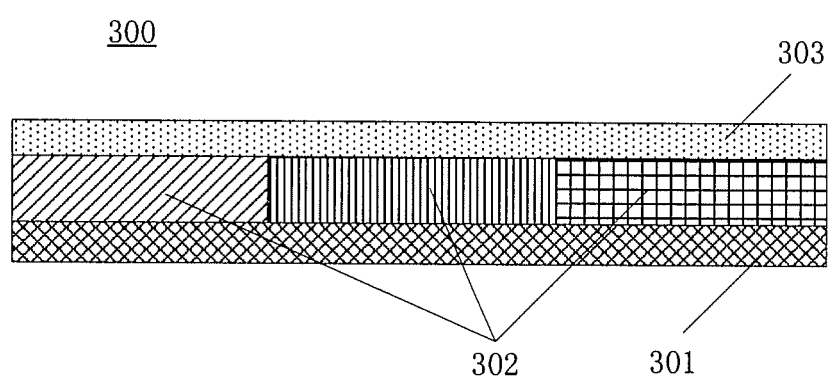
FIG. 4 is a schematic view of an organic electroluminescent display device according to an embodiment of the present invention.

FIG. 4 is a schematic view of an organic electroluminescent display device according to an embodiment of the present invention. The organic electroluminescent display device 300 comprises: a carrier plate 301; organic electroluminescent units 302 (i.e., pixels or sub-pixels) formed on the carrier plate 301; and the above mentioned display substrate 303; wherein the display substrate 303 is arranged on the light output side of the organic electroluminescent display device 300.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A display substrate comprising: a base substrate; and multiple metal touch electrodes formed in the same layer on a first surface of the base substrate; each touch electrode comprising an emitting electrode and a receiving electrode; and
 a black matrix formed on a second surface of the base substrate opposite to the first surface;
 wherein in a direction perpendicular to the display substrate, a projection of the black matrix completely covers a projection of the multiple metal touch electrodes.

2. The display substrate according to claim 1, wherein each touch electrode has a rectangular shape; the emitting electrode and the receiving electrode have substantially the same and complementary shapes.

3. The display substrate according to claim 2, wherein the emitting electrode and the receiving electrode have stair shapes.

4. The display substrate according to claim 1, wherein the emitting electrode and the receiving electrode have a thickness ranged from 300-500 nm.

5. The display substrate according to claim 1, wherein the material of the touch electrodes is molybdenum or molybdenum-aluminum alloy.

6. A method for manufacturing a display substrate comprising:
 providing a base substrate;
 forming multiple metal touch electrodes in the same layer on a first surface of the base substrate; each touch electrode comprising an emitting electrode and a receiving electrode; and
 forming a black matrix on a second surface of the base substrate opposite to the first surface;
 wherein in a direction perpendicular to the display substrate, a projection of the black matrix completely covers a projection of the multiple metal touch electrodes.

7. The method for manufacturing the display substrate according to claim 6, wherein each touch electrode has a rectangular shape; the emitting electrode and the receiving electrode have substantially the same and complementary shapes.

8. The method for manufacturing the display substrate according to claim 7, wherein the emitting electrode and the receiving electrode have stair shapes.

9. The method for manufacturing the display substrate according to claim 6, wherein the emitting electrode and the receiving electrode have a thickness ranged from 300-500 nm.

10. The method for manufacturing the display substrate according to claim 6, wherein the material of the touch electrodes is molybdenum or molybdenum-aluminum alloy.

11. The method for manufacturing the display substrate according to claim 6, wherein forming multiple metal touch electrodes comprises: forming a metal film; and forming the multiple metal touch electrodes with a patterning process.

12. A liquid crystal display device comprising the display substrate according to claim 1.

13. An organic electroluminescent display device comprising the display substrate according to claim 1.

* * * * *